United States Patent [19]

Mori et al.

[11] Patent Number: 4,821,033

[45] Date of Patent: Apr. 11, 1989

[54] MATRIX SWITCHING APPARATUS FOR PREVENTING PSEUDO INPUT

[75] Inventors: Masaharu Mori, Anjo; Sae Takenaka, Ichinomiya, both of Japan

[73] Assignee: Brother Kogyo Kabushiki Kaisha, Aichi, Japan

[21] Appl. No.: 947,917

[22] Filed: Dec. 29, 1986

[30] Foreign Application Priority Data

Jan. 8, 1986 [JP] Japan .................................. 61-2585

[51] Int. Cl.⁴ .......................... G06F 3/02; H04Q 1/00; G08C 25/00
[52] U.S. Cl. ................... 340/825.790; 341/24
[58] Field of Search ............ 340/365 E, 365.5, 825.79

[56] References Cited

U.S. PATENT DOCUMENTS

| | | | |
|---|---|---|---|
| 4,106,011 | 8/1978 | Melanson et al. | 340/365 E |
| 4,420,744 | 12/1983 | Jesson | 340/365 E |
| 4,502,039 | 2/1985 | Vercesi et al. | 340/365 E |
| 4,581,603 | 4/1986 | Ingold et al. | 340/365 E |
| 4,599,608 | 7/1986 | Matsuoka | 340/365 E |
| 4,617,554 | 10/1986 | Krause et al. | 340/365 E |
| 4,661,957 | 4/1987 | Okuhara | 371/59 |

FOREIGN PATENT DOCUMENTS

| | | |
|---|---|---|
| 3437410 | 4/1985 | Fed. Rep. of Germany . |
| 3519360 | 10/1985 | Fed. Rep. of Germany . |
| 60-39718 | 3/1985 | Japan . |
| 2009476 | 6/1979 | United Kingdom . |
| 2162351 | 1/1986 | United Kingdom . |

*Primary Examiner*—Donald J. Yusko
*Attorney, Agent, or Firm*—Parkhurst, Oliff & Berridge

[57] ABSTRACT

A matrix switching apparatus for preventing a pseudo input condition caused by a detour of a signal as well as output of an erroneous signal caused by a noise intruding into an apparatus and the like, in which a plurality of key lines having a plurality of switches are arranged in the first and second directions respectively. The apparatus includes a detector for detecting an ON condition of the plurality of switches by a time-sharing detection, a counter for counting up a number of the switches which are in the ON condition simultaneously, both totally and respectively with the key lines, a storage means for storing a first, second, third and fourth statuses which represent the condition of the switches respectively, and a controller for inverting the second status into the first status.

8 Claims, 5 Drawing Sheets

MATRIX SWITCHING APPARATUS FOR PREVENTING PSEUDO INPUT

BACKGROUND OF THE INVENTION

1. Field of the Invention

The present invention relates to a matrix switching apparatus used for input apparatus such as a keyboard, and more particularly relates to a matrix switch for preventing a pseudo input condition caused by a detour of a signal as well as an output of an erroneous signal caused by a noise intruding into an apparatus and the like.

2. Prior Art

The prior keyboard with matrix switches has been used as signal input apparatus for various electronic machines such as a typewriter. Upon using the aforementioned keyboard, however, as shown in FIG. 6, a so-called detour of a signal occurs when a plurality of key switches are operated simultaneously, resulting in pseudo input conditions in which non-operative keys are falsely detected as operative. Namely, a matrix switch circuit shown in FIG. 6 is connected to a scan-type encoder so as to output a scanning signal with level '0' to a driving line sequentially, which encodes key switches operated in accordance with detected voltage on a sensing line. The above driving and sensing lines are arranged in a matrix, respectively. When switches SW1, SW2 and SW3 are turned ON simultaneously, an electric current via a resistance R2 flows through SW3, then flows back through SW2, and further flows through SW1 into a driving line DL1. Consequently, a voltage V2 on a sensing line SL2 becomes '0' so that it seems as if a switch SW4 was ON. That is to say, assuming a square or an elongated square with four key switches in the matrix at each corner, when three switches of the square are turned ON, the remaining one is brought into a pseudo input condition.

Attempts have been made in the prior arts to solve the above problem. For example, as shown in FIG. 7, diodes D1-D6 for preventing reverse of current are connected in series with the key switches SW1-SW6 respectively in order to avoid a detour of a signal. Published unexamined Japanese Patent Application No. 60-39718 discloses a matrix switch circuit in which resistances are connected in series with key switches respectively, so that a logical circuit detects the difference between two voltages caused on a signal detection side both when a plurality of switches are operated simultaneously and when a pseudo input switch is really operated, so as to remove a detour signal.

The prior matrix switch circuit with diodes, however, fails to miniaturize and simplify the key switches, and allows its cost to be high. The circuit with resistances disclosed in the above Patent Application has defects such as an increase in the number of parts and manufacturing processes.

Moreover, the input apparatus with key switches, regardless of a contact or contactless switch types, generally have likelihood of generating erroneous function signals owing to a chattering phenomenon and an effect of the noise intruding into the apparatus, which causes an erroneous type and the like.

SUMMARY OF THE INVENTION

It is an object of the present invention to provide a matrix switching apparatus in which a microprocessor and the like can prevent a pseudo input condition of a switch caused by a detour when a plurality of switches are simultaneously turned ON.

It is another object of the present invention to provide a matrix switching apparatus in which constructions of a sheet switch and a mechanical switch are simplified since it is not necessary to connect diodes or resistors in series with the switches respectively like the prior arts.

It is a further object of the present invention to provide a matrix switching apparatus in which an erroneous function is certainly prevented not only since a pseudo input condition can be cancelled as described in the first object, but also since a chattering phenomenon and the like can be prevented.

A matrix switching apparatus according to the present invention in which a plurality of key lines having a plurality of switching means are arranged in the first and second directions respectively, includes detecting means for detecting an ON condition of the plurality of switching means by a time-sharing detection, counting means responsive to the detecting means for counting the number of the switching means which are in the ON condition simultaneously, totally and with regard to the key lines respectively, storage means for storing a first status representative of condition where an OFF condition is continuously detected twice by the detecting means, a second status representative of transition from the OFF condition to the ON condition, a third status representative of condition where the ON condition is continuously detected twice by the detecting means, and a fourth status representative of transition from the ON condition to the OFF condition of the switching means, and control means connected to the counting means add the storage means for changing the switching means in the second status into the first status when the number of the switching means in the ON condition simultaneously is four or more and when the switching means in the ON condition are two or more in each one key line in the transverse and longitudinal directions based upon one of the switching means in the ON condition simultaneously.

Thus, according to the present invention, when the detour is detected during the second scan after the ON condition of the switching means is detected during the first scan, the status of the switch is changed so that the signal ON is made invalid. Also, in the case of chattering and the like, i.e., when the OFF condition of the switching means is detected after the ON condition of the switching means is detected, the status is returned to the first, i.e. a status word '0', and the signal ON is made invalid. Moreover, when the signal OFF appears momentarily during the ON condition owing to the chattering and the like, the signal OFF is made invalid as far as the signal OFF is not detected during the subsequent scan.

BRIEF DESCRIPTION OF THE DRAWINGS

The above and other objects, features and advantages of the present invention will become more apparent from reading the following description of the preferred embodiments taken in connection with the accompanying drawings in which.

DETAILED DESCRIPTION OF THE PREFERRED EMBODIMENT

Figure 1:
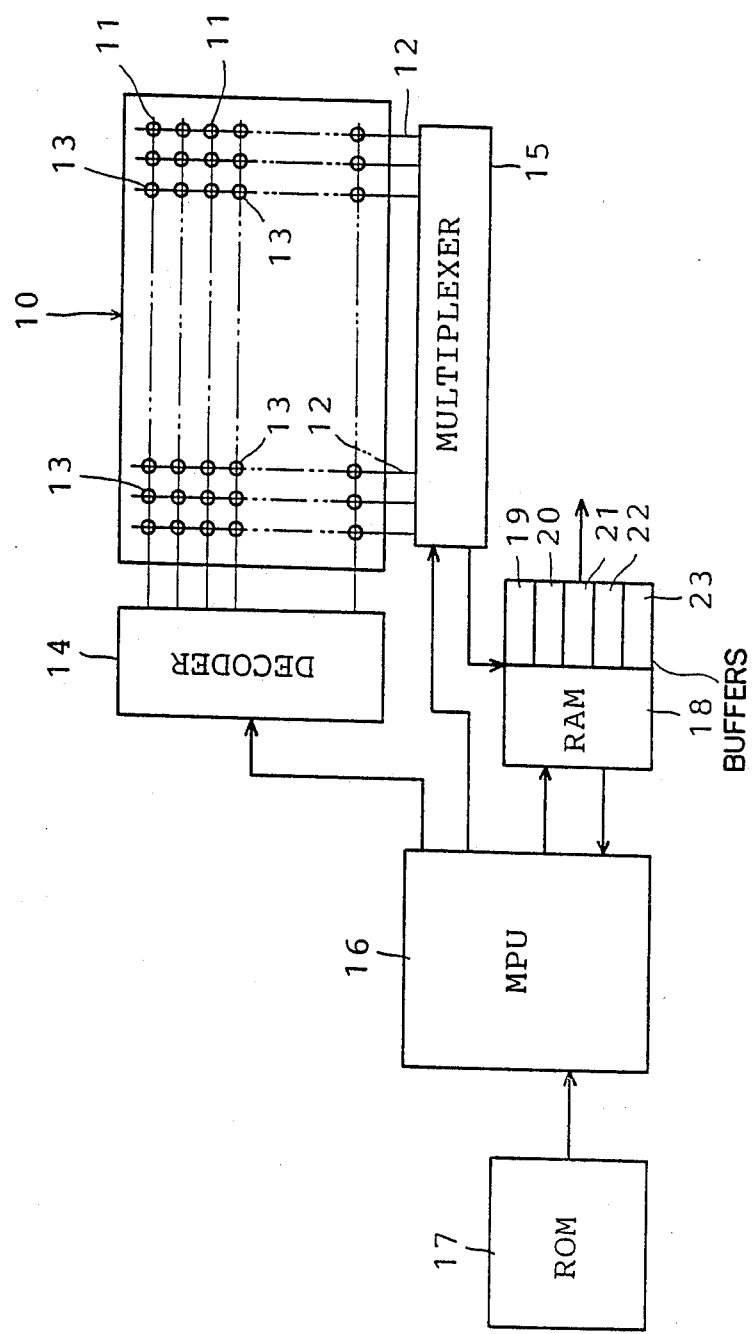
FIG. 1 is a block diagram illustrating a construction of a matrix switching apparatus according to the present invention.

Referring to FIG. 1, there is shown in a block diagram a matrix switching apparatus according to the invention. In a matrix switch circuit 10, there are provided a plurality of driving lines 11 and sensing lines 12 respectively in transverse and longitudinal directions, and a plurality of key switches 13 which are provided at each point of intersection of the above two lines 11 and 12 and open and close the above two lines 11 and 12. Each driving line 11 is connected with a decoder 14 which outputs a scanning pulse signal, and each sensing line 12 is connected with a multiplexer 15 which receives the scanning pulse signal sent via each switch 13 from the driving line 11 to each sensing line 12 sequentially and selectively.

A microprocessing unit (MPU) 16 outputs the scanning pulse signal to the decoder 14, and controls the selective operation of the multiplexer 15, so that it detects ON conditions of the key switches 13 by a time-sharing detection, and in accordance with the detection, counts the numbers of the key switches 13 in the ON condition simultaneously on all the driving and sensing lines 11 and 12, and on each lines 11 and 12 respectively. In a read only memory (ROM) 17, there is stored the operation program of this keyboard apparatus. In a random access memory (RAM) 18 which can both read and write, there are provided a key position buffer 19, a status buffer 20, a depressed key number buffer 21, a depressed key position buffer 22 and a key buffer 23, respectively.

Figure 3:
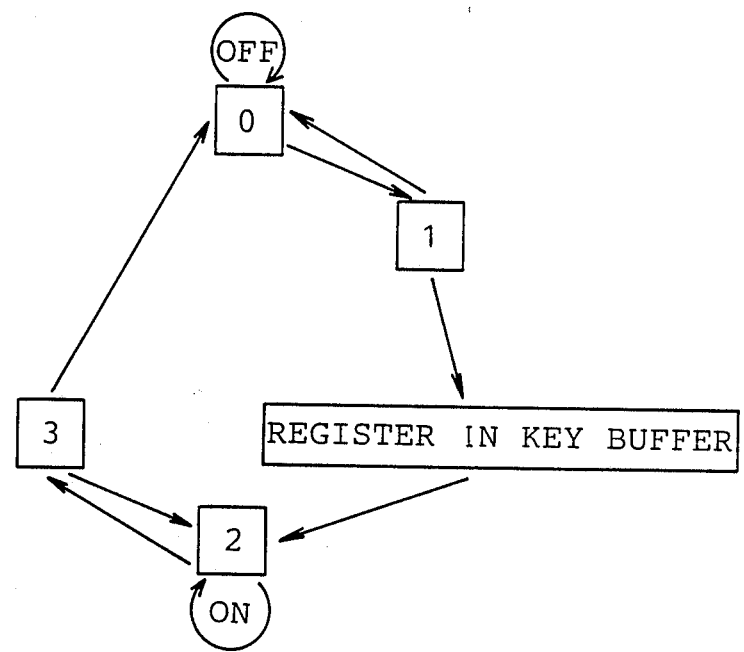
FIG. 3 is a view showing the transition of the status of a key switch.

The key position buffer 19 memorizes all the positions of the key switches 13 currently depressed. The status buffer 20, which is provided with a memory areas, each of which is in response to each memory area of the buffer 19, memorizes the ON/OFF data of each key switch 13 at every scan in accordance with the scanning signals which are sequentially selected and appear on each sensing line 12. The buffer 20 also memorizes the condition of each key switch 13 by means of one of the status words, as shown in FIG. 3, such as '0', '1', '2' and '3' which represent the first, second, third and fourth statuses respectively. The first status, which is represented as the status word '0', indicates that the key switch 13 is OFF during the continuous two scans. The second status, i.e., '1', indicates that the key switch 13 turns ON from OFF. The third status, i.e., '2', indicates that the key switch is kept ON. The fourth status, i.e., '3', indicates that the key switch 13 turns OFF from ON.

The depressed key number buffer 21 memorizes the number of the key switches 13 in the ON condition. The depressed key position buffer 22 memorizes the positions of the key switches 13 which are newly turned ON. The key buffer 23 memorizes the key switches 13 which have been determined to be operated for printing and the like.

Figure 2:
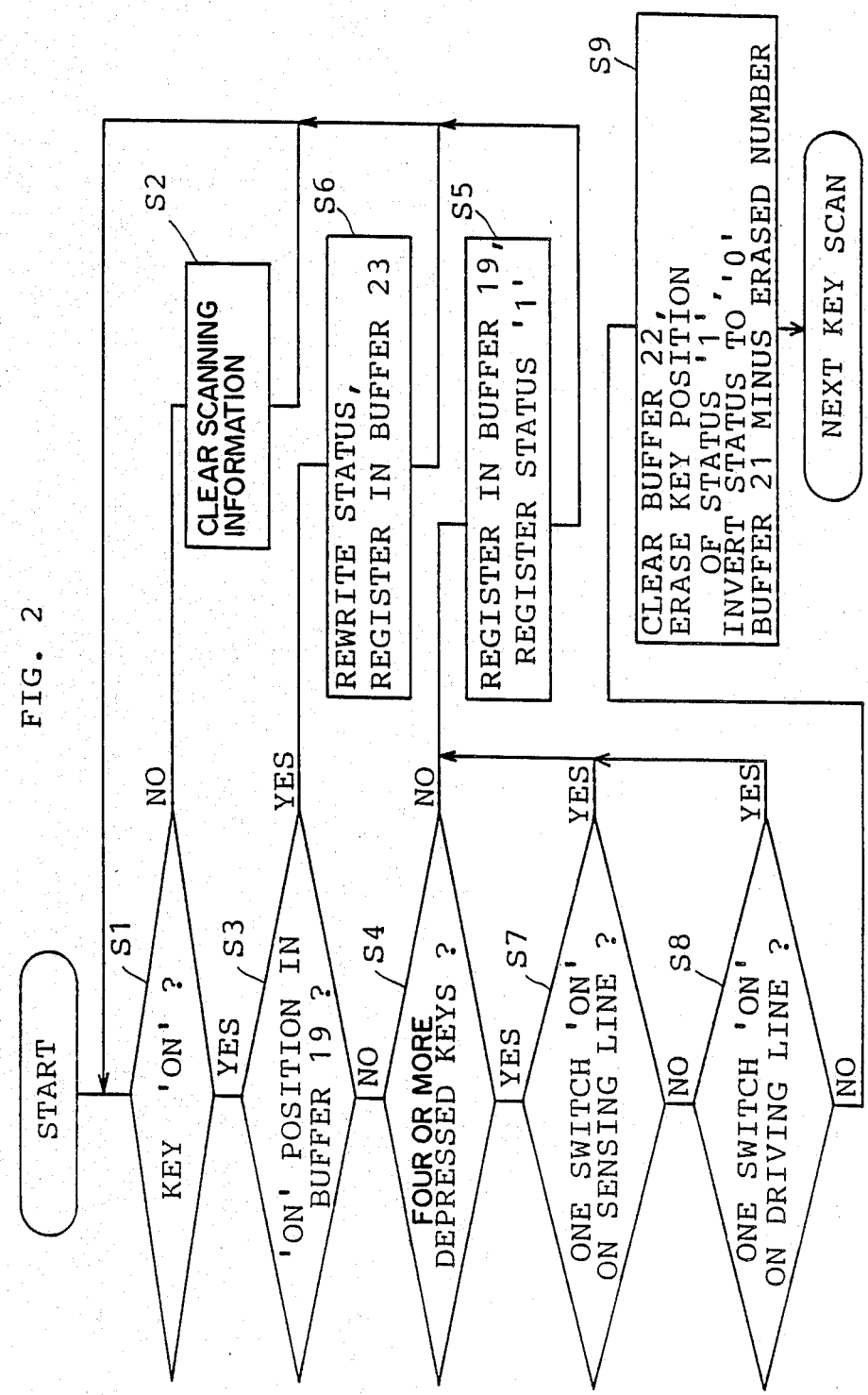
FIG. 2 is a flow chart showing the function of the apparatus.

Referring now to FIG. 2, there is shown in a flow chart the function of the matrix switching apparatus. The program shown in the flow chart of FIG. 2 proceeds under the control of the MPU 16.

The MPU 16 waits for the ON condition of the key switch 13 at steps S1 and S2. At that time, the status word '0' is written in each memory area of the buffer 20. Then the program proceeds to step S3 where the MPU 16 searches in the buffer 19, and determines whether the position of the key switch 13 in the ON condition has been already written there. In the case where the position is not written, that is to say, the key switch 13 is newly turned ON, the program proceeds to step S4 where it is determined whether the number of the key switches 13 currently depressed is four or more. If the determination is NO, it indicates that the detour has not occurred because the number of number of the depressed key switches is equal to or less than three. Then the program proceeds to step S5. Namely, the detour does not occur when the ON conditions are not detected with respect to four or more key switches 13. That is because, as described before, assuming a square or a rectangle with four key switches 13 in the matrix at each corner, the detour causes the pseudo input condition when three key switches 13 of the square are turned ON.

At step S5, the MPU 16 registers an information about the key switches 13, which were turned ON, to the buffer 19, as well as the status word '1' to the corresponding areas of the buffer 20. Then the program returns to step S1. When the ON conditions of the key switches 13 are detected again at the subsequent step S1, that is to say, during the subsequent scan, the determination of the step S3 is YES, since the positions of the depressed key switches 13 have been already registered.

Then the program proceeds to step S6 where the status word '1' is rewritten to '2', and the operation is determined in response to the key switches 13 in the ON condition, and registered in the buffer 23. The status word '2' is continued so long as the corresponding key switch 13 keeps the ON condition. Also, in the case where the ON condition of the key switch 13 is not continuously detected twice during the continuous two scans, that is to say, the determination of the step S1 during the first scan is accidentally YES owing to the chattering and noise intruding into the apparatus, the determination of the step S1 during the second scan is NO, and the status word '1' is rewritten to '0' again, so that the ON condition during the first scan is regarded as nonexistent.

Figure 4:
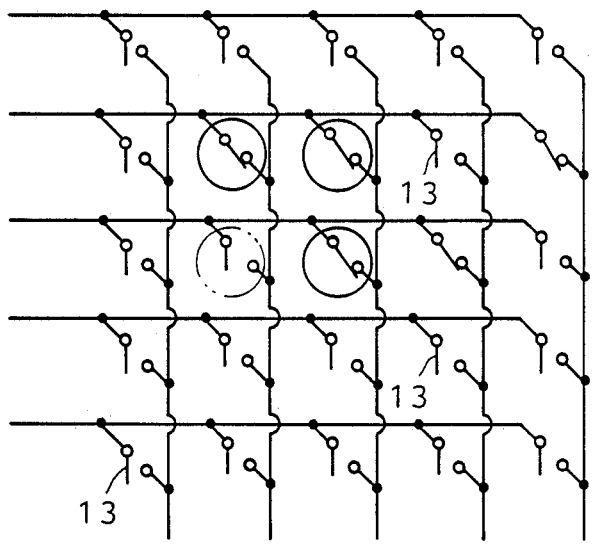
FIGS. 4 and 5 are diagrams of matrix circuits showing examples of a detour.
Figure 5:
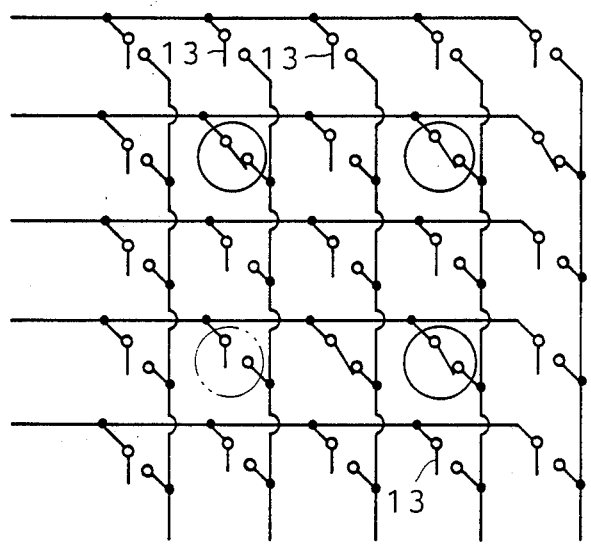
Figure 6:
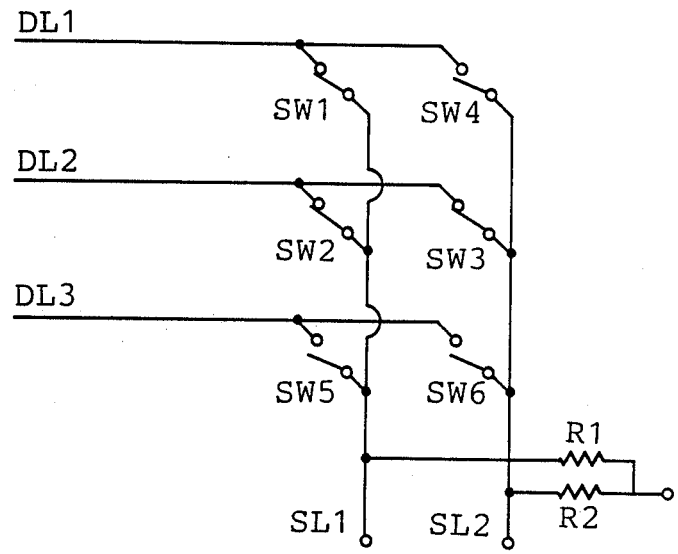
FIGS. 6 and 7 are diagrams of matrix circuits applied to the prior art.
Figure 7:
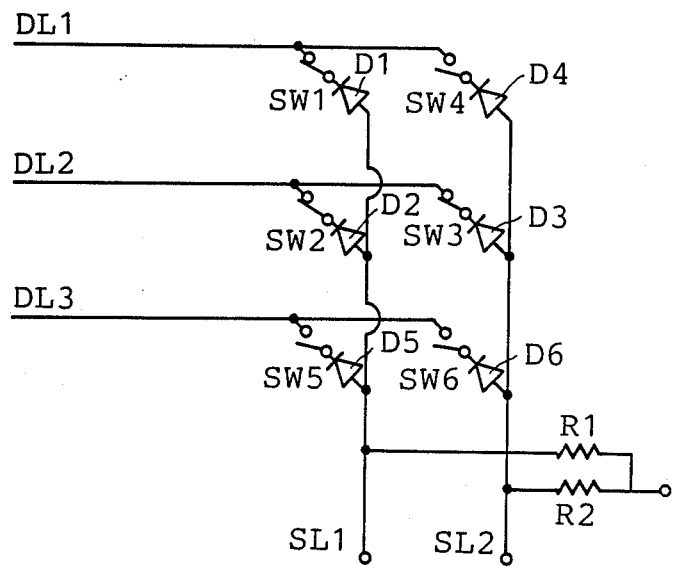

Furthermore, in the case where the determination of step S4 is YES, namely the key switches 13 simultaneously depressed are apparently four or more, and the likelihood of the detour occurs, the program proceeds to step S7. At step S7, there is executed the determination whether, based upon the last depressed key switch 13, the other key switch 13 is ON or not on the sensing line 12 which includes the above last depressed key switch 13. If the determination is YES, the program proceeds to step S5, since there is no likelihood of the detour. At step S5, the position of the newly depressed key switch 13 is registered in the buffer 19 as well as its status word '1' is registered in the corresponding area of the buffer 20. Also, in the case where the determination is NO at the above step S7, that is to say, the key switches 13 simultaneously depressed are two or more on the same sensing line 12, the program proceeds to step S8. At step S8, it is determined whether, based upon the key switch 13 which is detected as being in the ON condition during the latest scanning cycle, the other key switch 13 is ON or not on the driving line 11 which includes the above key switch 13 detected as being in the ON condition. If the determination is NO, the program returns to the above step S5. If YES, for example, as shown in FIGS. 4 and 5, the key switch 13 within the circle of dotted line is brought into the pseudo input condition and the detour occurs when the three key switches 13 within the circles of solid lines are ON, the program proceeds to step S9. At step S9, the MPU 16 erases the information about the last depressed key switch 13 from the buffer 22 as well as all the information about the other depressed key switches 13 from the buffer 19, and inverts the corresponding status word '1' in the buffer 20 to '0'. Furthermore, the MPU 16 subtracts a certain number from the buffer 21. The above 'certain number' represents the number of the key switches 13 the information of which was erased from the buffer 19. With the above operation, the detour can be detected as soon as it occurs, and the corresponding signal is made invalid so that the operation of erroneous printing and the like can be prevented.

Furthermore, the generation of the erroneous function signal caused by the chattering phenomenon and the like, can be prevented by the process described below. Namely, in the case where the OFF condition is detected during the newly scan with respect to a certain key switch 13 with the status word '2', the MPU rewrites the status word '2' to '3' once. Afterwards, the status word '3' is rewritten to '0' when the OFF condition is detected again during the subsequent scan. On the contrary, the status word '3' is rewritten to '2' again when the ON condition is detected at this time.

The present invention is not limited to the above embodiment in which the ON condition of the key switch 13 is detected by the serial scans. The matrix switching apparatus according to the present invention may have another constructions described below. Namely, the serial scans continues until the ON condition of the key switches are detected. Upon the above first detection, the MPU writes the status word '1' in the status buffer and establishes a waiting time of a certain period. The second detection is executed after the waiting time lapses. Then, the above status word '1' can be rewritten to either '2' or '0' in response to the result of the second detection.

While the preferred embodiment of the present invention has been described, it is to be understood that the invention is not limited thereto, and may be otherwise embodied within the scope of the following claims.

What is claimed is:

1. A switching apparatus arranged in a matrix having a plurality of rows and columns comprising:
    a plurality of switching means, each being arranged at an intersection of a row and a column;
    detecting means for sequentially detecting an ON condition of said plurality of switching means by scanning said switching means;
    counting means responsive to said detecting means for counting a first total number of said switching means in the ON condition in said matrix, a second total number of switching means in the ON condition in one of said rows and a third total number of said switching means in the ON condition in another of said columns in response to every detection of at least one of said switching means in the ON condition at an intersection of said one and another of said rows and columns;
    storage means for storing with respect to each of said switching means one of a first status representative of said switching means being detected in an OFF condition during a previous and a present scanning cycle, a second status representative of said switching means being detected in the OFF condition during the previous scanning cycle and being detected in the ON condition during the present scanning cycle, a third status representative of said switching means being detected in the ON condition during the previous and present scanning cycles, detected in the ON condition during the previous scanning cycle and being detected in the OFF condition during the present scanning cycle; and
    control means connected to said counting means and said storage means for changing a status of said switching means from said second status to said first status when said first total number is four or more and said second and third total number is two or more.

2. A switching apparatus according to claim 1 wherein said row comprises a driving line.

3. A switching apparatus according to claim 1 wherein said column comprises a sensing line.

4. A switching apparatus according to claim 1 wherein said detecting means comprises a multiplexer.

5. A switching apparatus according to claim 4 wherein said detecting means further comprises a decoder.

6. An apparatus for matrix switching according to claim 1 wherein said storage means includes a random access memory.

7. A switching apparatus arranged in a matrix as claimed in claim 1, wherein said control means changes the status of said switching means from the third status to the fourth status when an OFF condition is detected during the present scan, for switching means with the third status after the previous scan, and changes the status of said switching means to the first status when an OFF condition is detected during a subsequent scan and to the third status when the ON condition is detected in the subsequent scan.

8. A method for matrix switching comprising the steps of:
    providing a matrix having a plurality of rows and columns and a plurality of switching means each being arranged at an intersection of a row and column;
    detecting an ON condition of said plurality of switching means by scanning said switching means;
    counting a first total number of said switching means in said ON condition in said matrix; a second total number of switching means in the ON condition in one of said rows and a third total number of switching means in the ON condition in another of said columns in response to every detection of at least one of said switching means in the ON condition at an intersection of said rows and columns;
    storing with respect to each of said switching means one of a first status representative of said switching means being detected in an OFF condition during a previous and a present scanning cycle, a second status representative of said switching means being detected in the OFF condition during the previous scanning cycle and being detected in the ON condition during the present scanning cycle, a third status representative of said switching means being detected in the ON condition during the previous and present scanning cycles, and a fourth status representative of said switching means being detected in the ON condition during the previous scanning cycle and being detected in the OFF condition during the present scanning cycle; and changing a status of said switching means from said second status to said first status when said first total number is four or more and said second and third total number is two or more.

* * * * *